(12) United States Patent
Lee et al.

(10) Patent No.: US 11,367,646 B2
(45) Date of Patent: Jun. 21, 2022

(54) ELECTROSTATIC CHUCK AND ELECTROSTATIC CHUCK APPARATUS INCLUDING THE SAME

(71) Applicant: SEMES CO., LTD., Cheonan-si (KR)

(72) Inventors: Sang Kee Lee, Cheonan-si (KR); Yoshiaki Moriya, Yokohama (JP)

(73) Assignee: SEMES CO., LTD., Cheonan-si (KR)

( * ) Notice: Subject to any disclaimer, the term of this patent is extended or adjusted under 35 U.S.C. 154(b) by 254 days.

(21) Appl. No.: 16/741,178

(22) Filed: Jan. 13, 2020

(65) Prior Publication Data

US 2020/0227300 A1   Jul. 16, 2020

(30) Foreign Application Priority Data

Jan. 16, 2019 (JP) .............................. JP2019-005052

(51) Int. Cl.
*H01L 21/683* (2006.01)
*H01J 37/32* (2006.01)

(52) U.S. Cl.
CPC .... *H01L 21/6833* (2013.01); *H01J 37/32715* (2013.01)

(58) Field of Classification Search
CPC ........... H01L 21/68757; H01L 21/6875; H01L 21/6831; H01L 21/6833; H01L 21/67103; H01J 37/32715

USPC ........................................................ 361/234
See application file for complete search history.

(56) References Cited

U.S. PATENT DOCUMENTS

2009/0284894 A1* 11/2009 Cooke ................. H01L 21/6875
                                                     361/234
2015/0022936 A1*  1/2015 Cox ....................... H05K 3/285
                                                     361/234

FOREIGN PATENT DOCUMENTS

JP       06-291175        10/1994
JP       09-082788         3/1997
JP       2004079588 A  *  3/2004  ....... H01L 21/67109

* cited by examiner

*Primary Examiner* — Kevin J Comber
(74) *Attorney, Agent, or Firm* — Kile Park Reed & Houtteman PLLC

(57) ABSTRACT

An electrostatic chuck that fixes a work substrate by an electrostatic force, the electrostatic chuck is disclosed. The electrostatic chuck includes a dielectric plate being configured to support the work substrate, a base plate being configured to support the dielectric plate and an adsorption electrode interposed between the dielectric plate and the base plate, and being configured to generate an electrostatic force for adsorbing the work substrate. The dielectric plate is a sapphire plate, the base plate consists of a alumina ceramic material, the adsorption electrode has a resistance change rate of 20% or less in a range of −200° C. to 400° C., and the dielectric plate and the base plate are integrally bonded through the adsorption electrode.

10 Claims, 7 Drawing Sheets

ELECTROSTATIC CHUCK AND ELECTROSTATIC CHUCK APPARATUS INCLUDING THE SAME

CROSS-REFERENCE TO RELATED APPLICATION

The present application claims priority from Japanese Patent application No. 2019-005052, filed on Jan. 16, 2019 and all the benefits accruing therefrom under 35 U.S.C. § 119, the contents of which are incorporated by reference in their entirety.

TECHNICAL FIELD

The present disclosure relates to an electrostatic chuck and an electrostatic chuck apparatus including the same.

BACKGROUND

The present disclosure relates to an electrostatic chuck and an electrostatic chuck apparatus including the same.

Generally, an electrostatic chuck is positioned in a process chamber of semiconductor manufacturing equipment in order to support a wafer using an electrostatic force. The electrostatic chuck may include either an adsorption plate or a sapphire plate for fixing the wafer (Please refer to related arts as below).

The related arts are disclosed in Japanese Patent Application Laid Open Publication Nos. 1994-291175 and 1997-82788.

The sapphire plate may be bonded to an insulation plate using a bonding agent such as an adhesive agent, and the insulation plate may be bonded to a supporting plate using the adhesive agent. However, it may be difficult to utilize the electrostatic chuck in a heat-treatment process because the adhesive agent for bonding the sapphire plate to the insulation plate may be easily exposed to plasma to generate arc or discharge. On the other hand, when not using the bonding agent, it may be required to carry out a fusion process for melting a portion of the sapphire plate at a relatively high temperature, which may cause a surface of the sapphire plate damaged or the characteristics thereof deteriorated. Further, it may be difficult to embed conductive materials into the sapphire plate, and therefore may be difficult to function as the electrostatic chuck.

SUMMARY

The present invention provides an electrostatic chuck and an electrostatic chuck apparatus having an improved plasma resistance property and being capable of suppressing characteristics from deteriorating even in an extremely low temperature region in a high temperature region.

In accordance with an aspect of the present disclosure, an electrostatic chuck that fixes a work substrate using an electrostatic force, the electrostatic chuck includes a dielectric plate being configured to support the work substrate, a base plate being configured to support the dielectric plate and an adsorption electrode interposed between the dielectric plate and the base plate, and being configured to generate an electrostatic force for adsorbing the work substrate, wherein the dielectric plate is a sapphire plate, the base plate consists of a alumina ceramic material, the adsorption electrode has a resistance change rate of 20% or less in a range of $-200°$ C. to $400°$ C., and the dielectric plate and the base plate are integrally bonded through the adsorption electrode.

In an example embodiment, the adsorption electrode may consist of a ceramic composite having an alumina ceramic material, a conductive material and an oxide-based eutectic material, and the dielectric plate and the base plate may be re-sintered with the adsorption electrode In an example embodiment, the base plate may include a through hole penetrating along a thickness direction, a power supply electrode may be disposed in the through hole to be electrically connected to the adsorption electrode, and the power supply electrode may include a material identical to that of the adsorption electrode.

In an example embodiment, each of the dielectric plate, the adsorption electrode, and the base plate may have a linear thermal expansion coefficient of $8.0 \times 10^{-6}$/K or less.

In an example embodiment, an upper surface of the dielectric plate may have a surface roughness Ra of 0.05 μm or less.

In an example embodiment, the dielectric plate may include a convex portion which protrudes from an upper surface thereof, the convex portion may have a diameter of 0.3 mm to 3.0 mm or less and a height of 0.05 mm or less, and the convex portion may include a ridge portion formed at an upper end thereof and curved along a side thereof, and the ridge portion has a radius of 0.03 mm or less.

Here, an upper surface of the dielectric plate may have a surface roughness Ra of 0.3 μm or less.

In accordance with an aspect of the present disclosure, an electrostatic chuck apparatus includes an electrostatic chuck that fixes a work substrate by an electrostatic force, a supporting plate including a flow path through which a coolant for cooling the electrostatic chuck flows and a bonding agent for bonding the electrostatic chuck and the supporting plate, wherein the electrostatic chuck includes a dielectric plate being configured to support the work substrate, a base plate being configured to support the dielectric plate and an adsorption electrode interposed between the dielectric plate and the base plate, and being configured to generate an electrostatic force for adsorbing the work substrate, wherein the dielectric plate is a sapphire plate, the base plate consists of a alumina ceramic material, the adsorption electrode has a resistance change rate of 20% or less in a range of $-200°$ C. to $400°$ C., and the dielectric plate and the base plate are integrally bonded through the adsorption electrode.

In accordance with an aspect of the present disclosure, an electrostatic chuck apparatus includes an electrostatic chuck that fixes a work substrate by an electrostatic force, and a supporting plate including a flow path through which a coolant for cooling the electrostatic chuck flows, the electrostatic chuck being directly boned to the supporting plate, wherein the electrostatic chuck includes a dielectric plate being configured to support the work substrate, a base plate being configured to support the dielectric plate and an adsorption electrode interposed between the dielectric plate and the base plate, and being configured to generate an electrostatic force for adsorbing the work substrate; wherein the dielectric plate is a sapphire plate, the base plate consists of a alumina ceramic material, the adsorption electrode has a resistance change rate of 20% or less in a range of $-200°$ C. to $400°$ C., and the dielectric plate and the base plate are integrally bonded through the adsorption electrode.

According to the example embodiments of the present invention, it is possible to provide an electrostatic chuck and an electrostatic chuck apparatus capable of having improved plasma-resistant characteristics such that plasma-resistant characteristics are suppressed from deteriorating in an extremely low to high temperature range.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Example embodiments can be understood in more detail from the following description taken in conjunction with the accompanying drawings, in which.

DETAILED DESCRIPTION

Figure 1:
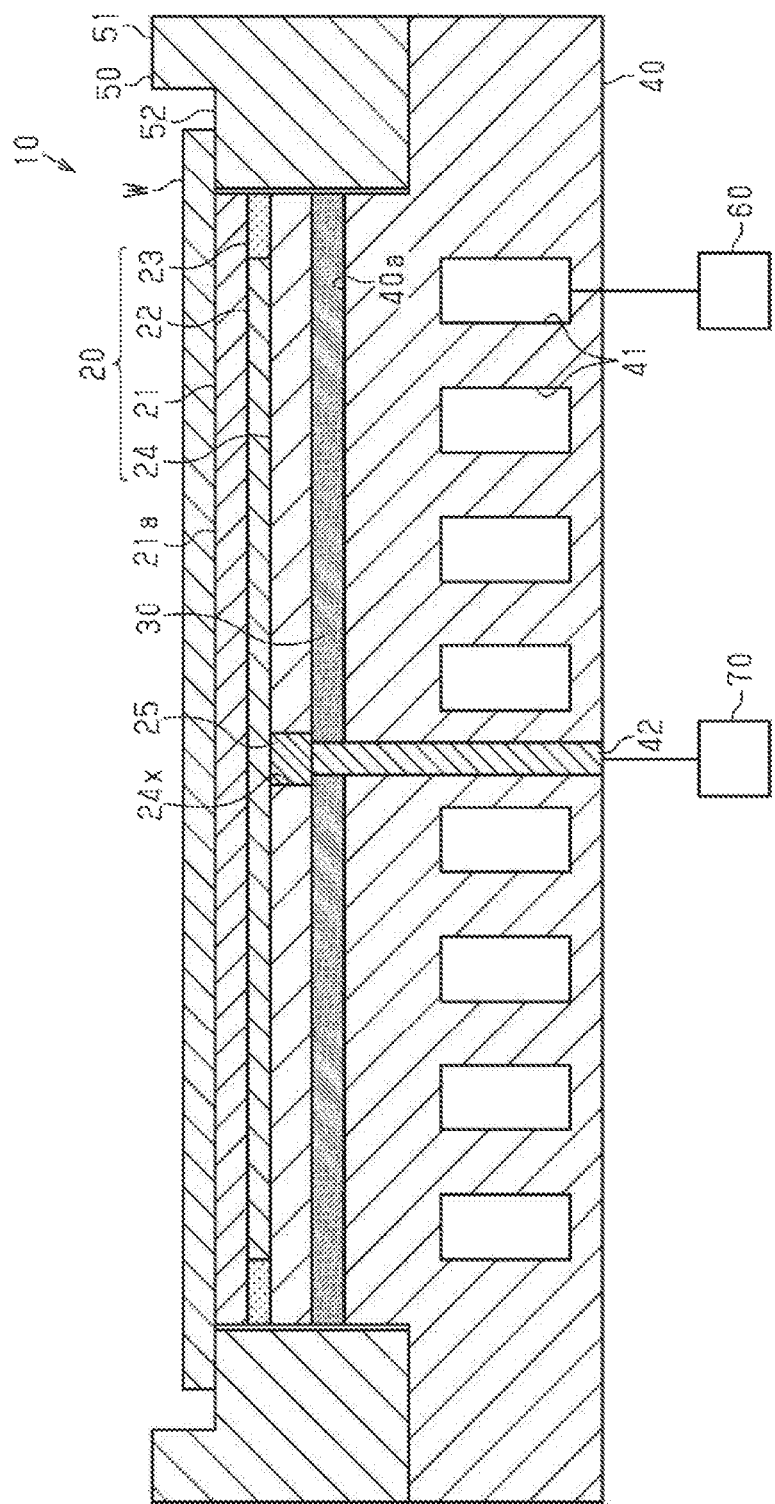
FIG. 1 is a cross sectional view illustrating an electrostatic chuck apparatus in accordance with an example embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

Hereinafter, specific embodiments on a raceway unit and an OHT having the same will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout. In the figures, the dimensions of layers and regions are exaggerated for clarity of illustration.

The terms such as first, second, etc., can be used in describing various elements, but the above elements by the above terms should not be limited. The above terms are one element from the other used only to distinguish. For example, in the present invention without departing from the scope of the first component to the second component may be named similarly, the second component to the first component also can be named.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating an electrostatic chuck apparatus in accordance with an example embodiment of the present disclosure.

Referring to FIG. 1, an electrostatic chuck apparatus 10 in accordance with an example embodiment may absorb and support a work substrate W using an electrostatic force. The work substrate W may include a semiconductor wafer. The electrostatic chuck apparatus 10 may be installed in a substrate treating equipment for treating the work substrate W. For example, the substrate treating equipment generates plasma to plasma-treat the work substrate W.

The electrostatic chuck apparatus 10 in accordance with an example embodiment includes an electrostatic chuck 20, a bonding agent 30 and a supporting plate 40.

The electrostatic chuck 20 includes a dielectric plate 21, an adsorption electrode 22, an insulating layer 23 and a base plate 24.

In an example embodiment, the dielectric plate 21 may be a sapphire plate. The sapphire plate may be made of a single crystalline material of aluminum oxide ($A_2O_3$), and may have an excellent plasma resistance free of grain boundaries. The dielectric plate 21 may have a circular shape, for example, in a plan view. The plan view depicts an object when the object is viewed in a vertical direction of an upper surface 21a of the dielectric plate 21. The dielectric plate 21, which is a sapphire substrate, has a thermal expansion coefficient of $7.7 \times 10^{-6}$/K at a temperature of below 400° C. A volume resistance value of the sapphire plate is $1.0 \times 10^{14}$ Ω·cm or more. The dielectric plate 21 may have a thickness in a range of 0.3 mm to 0.5 mm.

The adsorption electrode 22 is provided between the dielectric plate 21 and the base plate 24. In an example embodiment, the adsorption electrode 22 may have a circular shape generally in the plan view. In addition, the adsorption electrode 22 may be formed in a predetermined pattern. Further, a plurality of adsorption electrodes 22 may be provided on the base plate 24 by an adsorption process.

The adsorption electrode 22 may include composite ceramic materials having aluminum oxide ($Al_2O_3$) and a conductive material. The conductive material may include an alumina titanium carbide (AlTiC) material. The AlTiC material can be obtained by dispersing titanium carbide (TiC) into aluminum oxide ($Al_2O_3$), and then performing a reaction sintering process. A thermal expansion coefficient of AlTiC material is $7.4 \times 10^{-6}$/K in a temperature range of 400° C. or less. The volume resistance value of the AlTiC material is $1.0 \times 10^{-3}$ Ω·cm, and the resistance change rate of the AlTiC material is less than 20% in a temperature range of −200° C. to 400° C. Yttrium oxide ($Y_2O_3$), ytterbium oxide ($Yb_2O_3$), or the like can be used as an oxide-based eutectic point material. The adsorption electrode 22 may be formed using a conductive paste containing the $Al_2O_3$, TiC or AlTiC powder.

The insulating layer 23 is provided between the dielectric plate 21 and the base plate 24, and be positioned around the adsorption electrode 22. In an example embodiment, the insulating layer 23 may have substantially an annular shape in the plan view. When a plurality of the adsorption electrodes 22 having a predetermined pattern are provided, the insulating layer 23 is provided between the adsorption electrodes 22 to isolate the adsorption electrodes 22 from each other. The insulating layer 23 is provided at least along a periphery of the dielectric plate 21. The insulating layer 23 may include alumina ($Al_2O_3$). The insulating layer 23 may be formed using an insulating paste containing alumina ($Al_2O_3$) powders.

The base plate 24 has, for example, a circular shape in the plan view. The base plate 24 has a through hole 24x which penetrates the base plate 24 in a thickness direction. A power supply electrode 25 is provided in the through hole 24x. The power supply electrode 25 is electrically connected to the adsorption electrode 22. The base plate 24 may include the alumina ($Al_2O_3$) ceramic material. The coefficient of thermal expansion of the base plate 24 is $7.2 \times 10^{-6}$/K in a temperature range of 400° C. or less. The volume resistance of alumina ($Al_2O_3$) which the base plate 24 is composed of is $1.0 \times 10^{14}$ Ω·cm or more. The power supply electrode 25, for example, is made of a material identical to that of the adsorption electrode 22.

The electrostatic chuck 20 may correspond to a substrate in which the adsorption electrode 22 containing AlTiC material is interposed between the dielectric plate 21 made of a sapphire substrate and the base plate 24 made of alumina ceramic material. That is, the electrostatic chuck 20 in accordance with an embodiment does not use a bonding agent such as an adhesive.

Figure 2:
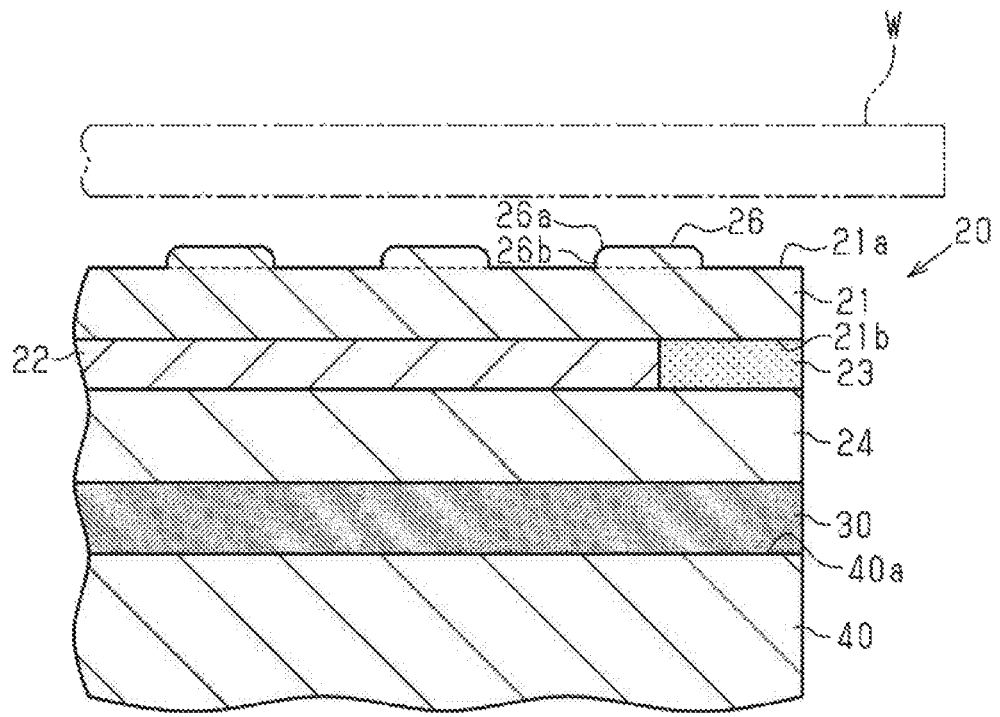
FIG. 2 is an enlarged cross sectional view illustrating a portion of the electrostatic chuck apparatus as shown in FIG. 1.
Figure 3:
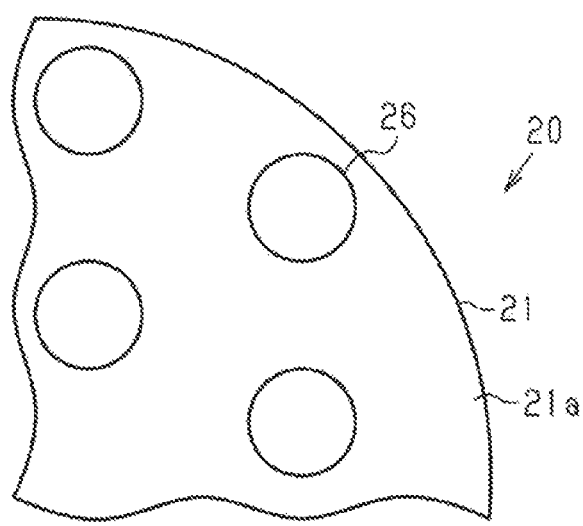
FIG. 3 is an enlarged plan view illustrating a portion of the electrostatic chuck apparatus as shown in FIG. 1.

FIG. 2 is an enlarged cross sectional view illustrating a portion of the electrostatic chuck apparatus as shown in FIG. 1. FIG. 3 is an enlarged plan view illustrating a portion of the electrostatic chuck apparatus as shown in FIG. 1.

As shown in FIGS. 2 and 3, the dielectric plate 21 has a plurality of convex portions 26 disposed on an upper surface 21a thereof. Each of the convex portions 26 has a columnar shape in accordance with an embodiment. Each of the convex portions 26 may has a ridge portion 26a curved along a side surface 26b at an upper portion thereof.

In an example embodiment, one height of the dielectric plate 21 including the convex portions 26 is 0.3 mm. Alternatively, when another height is defined as a height measured from a lower surface 21b to the upper surface 21a of the dielectric plate 21 without the convex portions 26, the another height of the dielectric plate 21 may be 0.3 mm. Each of the convex portions 26 may have a diameter in a range of 0.3 mm to 3 mm. Further, a height of each of the convex portions 26 may be in a range of 0.03 mm to 0.05 mm. A radius of the ridged portion around the upper peripheral edge is in a range of 0.01 mm to 0.03 mm. A surface roughness of the dielectric plate 21 may be 0.05 μm or less in terms of a surface roughness Ra. The surface roughness of the upper surface 21a of the dielectric plate 21 may be 0.3 μm or less in terms of the surface roughness Ra. In an embodiment, each of the convex portions 26 is 0.5 mm in diameter, 0.03 mm in height, and 0.01 mm in radius of the ridged portion.

As shown in FIG. 1, the electrostatic chuck 20 is bonded to an upper surface 40a of the supporting plate 40 via a bonding agent 30. As the bonding agent 30, for example, either a heat-resistant adhesive resin such as a polyimide resin, a silicon resin, and an epoxy resin, or a brazing material or the like may be used.

The supporting plate 40 includes a flow path 41 formed therein. The flow path 41 may serve as a path through which a coolant flows, and the coolant is supplied from the supply source 60 through the flow path 41. As the coolant, a gas such as helium (He) or nitrogen (N2), water, a dedicated organic solvent, or the like can be used. Therefore, the electrostatic chuck apparatus 10 may cools the work substrate W adsorbed to the electrostatic chuck 20.

The supporting plate 40 has an extraction electrode 42. The extraction electrode 42 is connected to the power supply electrode 25 of the electrostatic chuck 20. The extraction electrode 42 is connected to a power supply 70. The power supply 70 may supply a voltage required for absorbing the work substrate W into the adsorption electrode 22 via both the extraction electrode 42 and the power supply electrode 25.

The electrostatic chuck 20 shown in FIG. 1 may further include a focus ring 50. The focus ring 50 is disposed in a peripheral region of the electrostatic chuck 20. The focus ring 50 has a ring shape and is arranged along the periphery of the electrostatic chuck 20. An upper surface of the focus ring 50 has a stepped portion such that an outer portion 51 is higher than an inner portion 52. The inner portion 52 disposed on the upper surface of the focus ring 50 is positioned at the same height as the upper surface of the electrostatic chuck 20 such that the inner portion 52 has an upper surface coplanar with the upper surface of the dielectric plate 21. The inner portion 52 of the focus ring 50 may support a peripheral region of the work substrate W located outside from the electrostatic chuck 20. The outer portion 51 of the focus ring 50 is positioned so as to surround the peripheral region of the work substrate W. The focus ring 50 extends an electric field area so that the work substrate W is located at a center of a plasma region. Therefore, the plasma region is uniformly and entirely formed over an area of the work substrate W, and an area of the work substrate W is uniformly plasma-treated.

Next, a method of manufacturing the electrostatic chuck 20 will be described. For convenience of explanation, elements that are to be finally transformed into constituent elements of the electrostatic chuck 20 will be described with reference numerals identical those of the final constituent elements.

Figure 5:
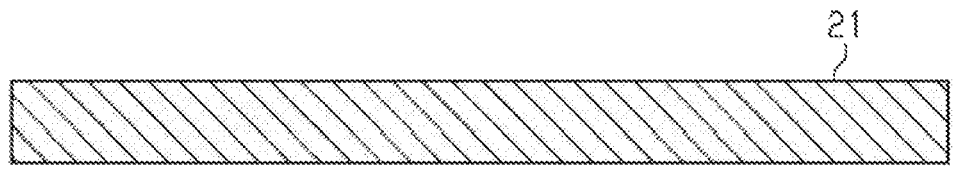
FIG. 5 is a cross sectional view illustrating a step of manufacturing an electrostatic chuck in accordance with an example embodiment of the present disclosure.

Referring to FIG. 5, a substrate 21 made of a sapphire plate is treated into a desired shape. The desired shape, for example, includes a circular plate shape.

Figure 6:
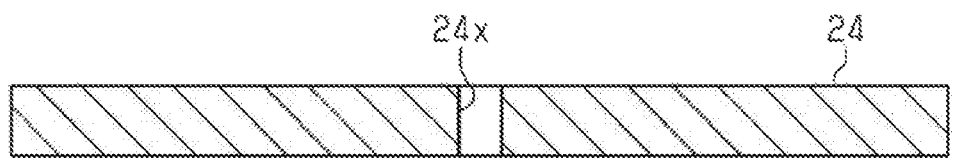
FIG. 6 is a cross sectional view illustrating a step of manufacturing an electrostatic chuck in accordance with an example embodiment of the present disclosure.

As shown in FIG. 6, an alumina ($Al_2O_3$) substrate 24 is machined into a desired shape. For example, the substrate 24 has a circular plate having a through hole 24x penetrating therethrough.

Figure 7:
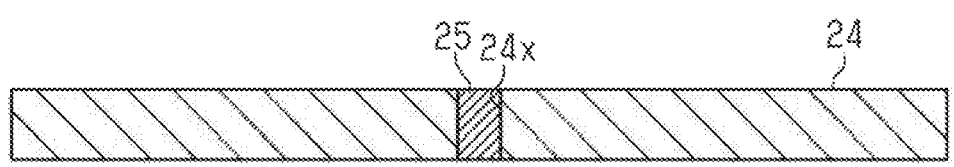
FIG. 7 is a cross sectional view illustrating a step of manufacturing an electrostatic chuck in accordance with an example embodiment of the present disclosure.

Referring to FIG. 7, a power supply electrode 25 is formed in the through hole 24x of the substrate 24. The power supply electrode 25 may be formed by inserting, for example, a column-shaped member having a shape corresponding to the through hole 24x into the through hole 24x. Alternatively, the power supply electrode 25 may be formed by filling the through hole 24x with a conductive paste.

Figure 8:
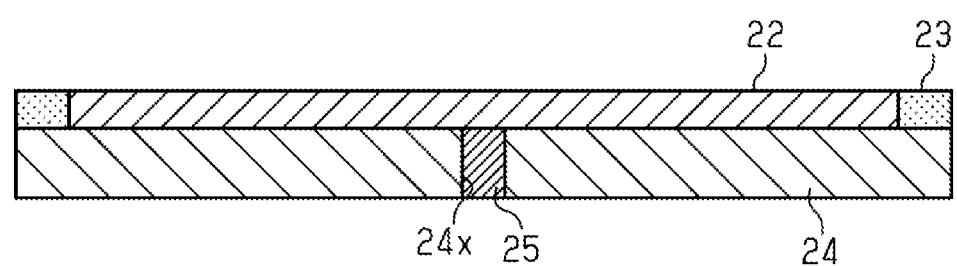
FIG. 8 is a cross sectional view illustrating a step of manufacturing an electrostatic chuck in accordance with an example embodiment of the present disclosure.

As shown in FIG. 8, a conductive paste 22 and an insulating paste 23 are disposed on a surface of the substrate 24. The conductive paste 22 and the insulating paste 23 may be supplied onto the substrate 24 by a coating process such as a screen printing process.

Figure 9:
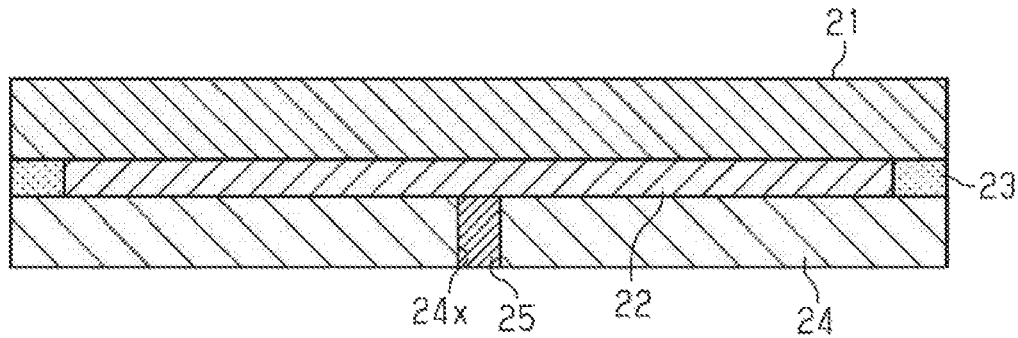
FIG. 9 is a cross sectional view illustrating a step of manufacturing an electrostatic chuck in accordance with an example embodiment of the present disclosure.

As shown in FIG. 9, the substrate 21 is placed on the substrate 24 on which the conductive paste 22 and the insulating paste 23 are disposed.

Figure 10:
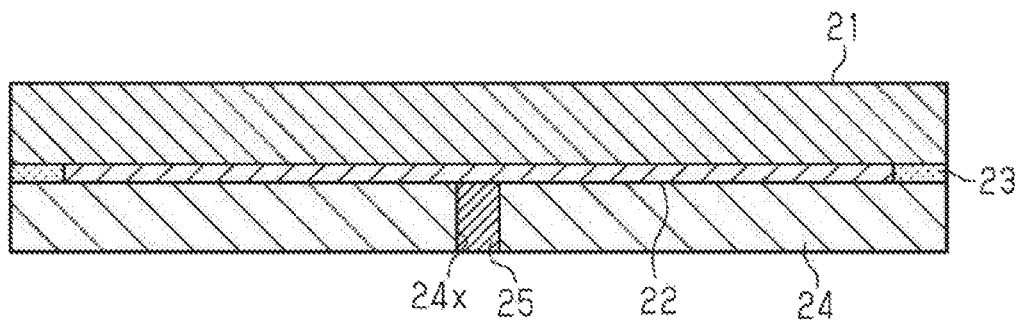
FIG. 10 is a cross sectional view illustrating a step of manufacturing an electrostatic chuck in accordance with an example embodiment of the present disclosure.

As shown in FIG. 10, a heat treatment process is performed in a firing furnace equipment against the substrates 21 and 24, and the conductive paste 22 and the insulating paste 23 interposed between the substrates 21 and 24. The firing furnace equipment may include a pressure sintering apparatus (e.g. a hot pressing apparatus), a plasma-discharging sintering furnace apparatus, or the like. In firing process conditions, a pressing pressure reaches to 10 MPa, a firing temperature is 1,700° C., and a firing process time is 2 hours.

Figure 11:
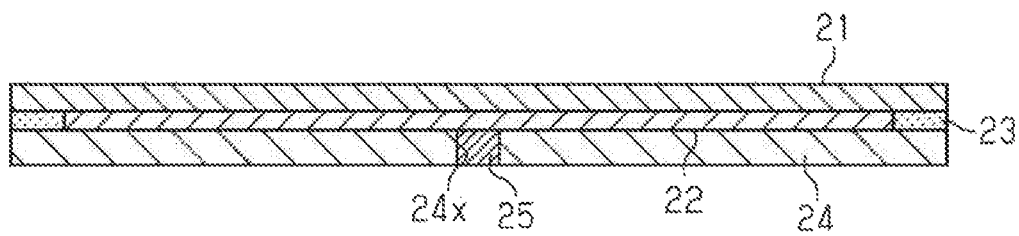
FIG. 11 is a cross sectional view illustrating a step of manufacturing an electrostatic chuck in accordance with an example embodiment of the present disclosure.

Referring to FIG. 11, a plane grinding and polishing process is carried against the substrates 21 and 24 to form a dielectric plate 21 and a base plate 24 having a desired thickness. The desired thickness of the dielectric plate 21 is 0.3 mm, for example.

Figure 12:
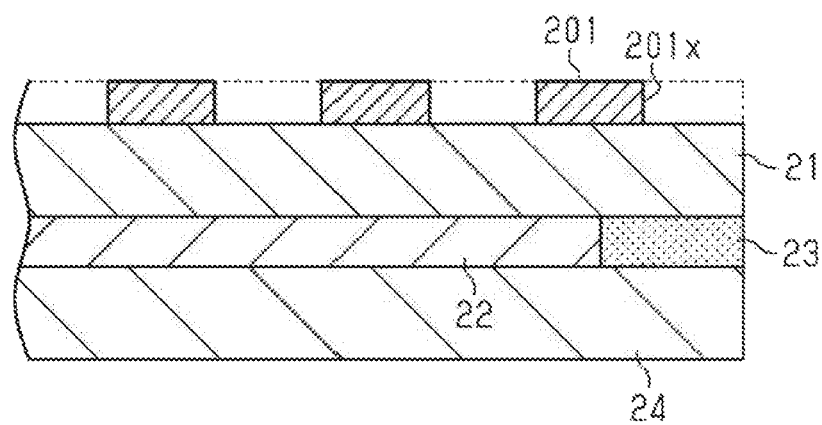
FIG. 12 is a cross sectional view illustrating a step of manufacturing an electrostatic chuck in accordance with an example embodiment of the present disclosure.

Referring to FIG. 12, a process mask 201 is formed on the dielectric plate 21. The process mask 201 is formed on the substrate 21 so as to cover areas for forming convex portions 26 shown in FIGS. 2 and 3, and has an opening 201x exposing an upper surface of the substrate 21.

Figure 13:
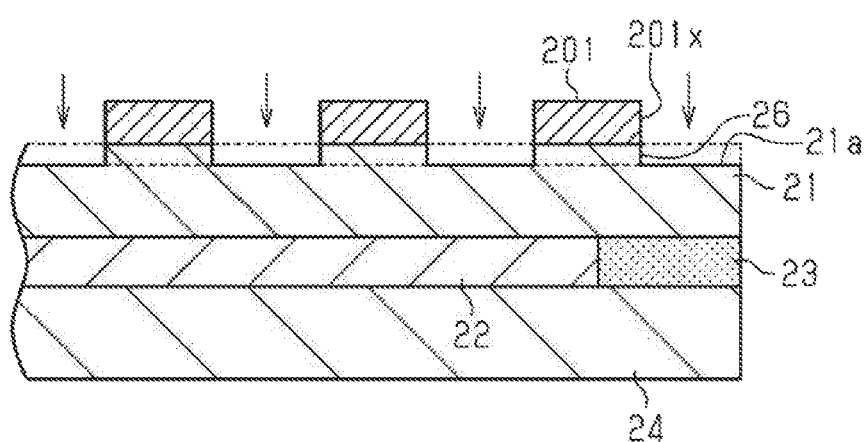
FIG. 13 is a cross sectional view illustrating a step of manufacturing an electrostatic chuck in accordance with an example embodiment of the present disclosure.

As shown in FIG. 13, the substrate 21 is partially removed through a sandblasting process using the opening 201x of the processing mask 201 to form the convex portions 26. A size of each of the convex portions 26 is, for example, 0.5 mm in diameter and 0.03 mm in height. the convex portions 26 may have an arbitrary size in accordance with a shape of the processing mask 201. For example, depending on the shape of the processing mask 201, each of the convex portions 26 may have an arbitrary shape such as a quadrangle or a hexagon. Further, by adjusting a processing time, each of the convex portions 26 may have an arbitrary height. The processing mask 201 is removed then.

Figure 14:
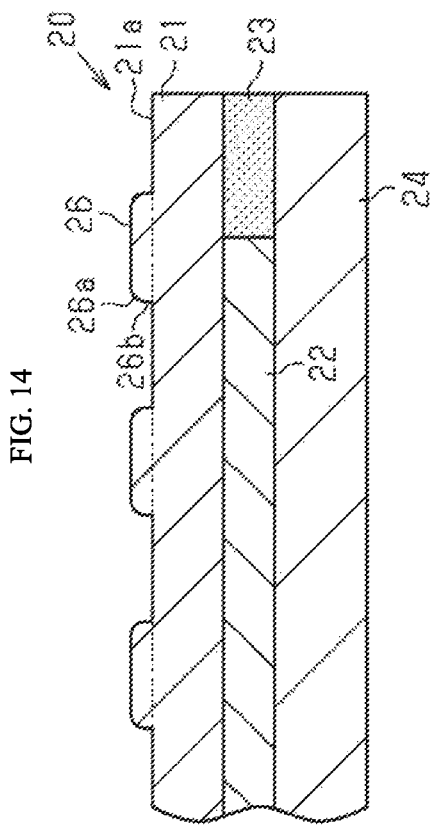
FIG. 14 is a cross sectional view illustrating a step of manufacturing an electrostatic chuck in accordance with an example embodiment of the present disclosure.

As shown in FIG. 14, an edge polishing process is performed against the convex portions 26 such that upper end peripheral portions of the convex portions 26 may have arc shapes. In a cross sectional view of the dielectric plate 21 in a thickness direction, a radius of each of the ridge portions 26a is, for example, 0.01 mm.

Through the above-described processes, the electrostatic chuck 20 including the dielectric plate 21, the adsorption electrode 22, the insulating layer 23, the base plate 24, and the power supply electrode 25 is formed.

Next, the electrostatic chuck 20 is bonded to the supporting plate 40 via a bonding agent 30 shown in FIG. 1. Therefore, the electrostatic chuck apparatus 10 including the electrostatic chuck 20 and the supporting plate 40 is manufactured.

Next, a method for evaluating the electrostatic chuck apparatus 10 will be described.

According to the electrostatic chuck apparatus 10 as described above, the work substrate W is adsorbed and fixed to the electrostatic chuck 20. In this state, an environmental temperature is changed within a predetermined range. For example, the environmental temperature is in a range of −200° C. to 200° C.

Then, a value of the current flowing through the work substrate W is measured to confirm a change in a resistance value of the dielectric plate 21 made of the sapphire substrate. Further, by measuring a change in a surface potential of the work substrate W, for example, an increased value of the surface potential, it is possible to confirm a change in the resistance values of the power supply electrode 25 and the adsorption electrode 22.

Figure 4:
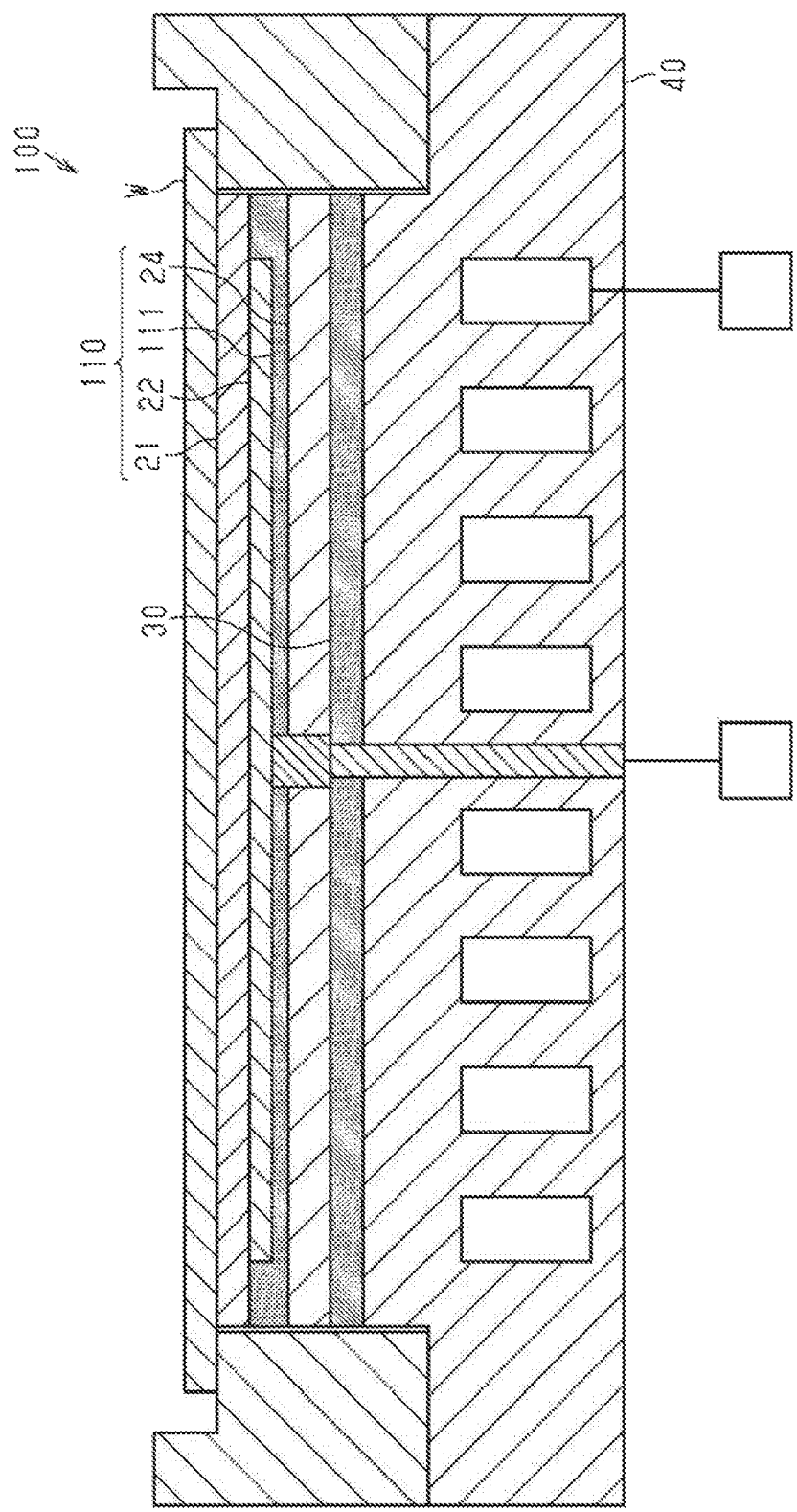
FIG. 4 is a cross sectional view illustrating an electrostatic chuck apparatus as a comparative example.

FIG. 4 is a cross sectional view illustrating an electrostatic chuck apparatus as a comparative example. For convenience of explanation, elements included in an electrostatic chuck apparatus 100 in FIG. 4 will be described with reference numerals identical to those of the elements described in FIGS. 1 to 3.

According to an electrostatic chuck 110 included in the electrostatic chuck apparatus 100 as the comparative example shown in FIG. 4, a dielectric plate 21 is bonded to a base plate 24 via a bonding agent 111. Since the dielectric plate 21 has a small thickness (for example, 0.3 mm), the bonding agent 111 for bonding the dielectric plate 21 to the base plate 24 may be strongly affected by the plasma which occurs in a manufacturing equipment including the electrostatic chuck apparatus 100 such as a plasma processing equipment. As a result, the bonding agent 111 may be corroded to easily generate dust and discharge.

On the other hand, the electrostatic chuck apparatus 10 in accordance with an example embodiment of the present embodiment illustrated in FIG. 1 includes an electrostatic chuck 20 which may adsorbs and fixes a work substrate W to the dielectric plate 21, and a supporting plate 40 having a flow path through which a coolant for cooling the electrostatic chuck 20 flows. The electrostatic chuck 20 includes the dielectric plate 21 on which the work substrate W is disposed, the base plate 24 for supporting the dielectric plate 21, and the adsorption electrode 22 interposed between the dielectric plate 21 and the base plate 24, and being configured for generating the electrostatic force to absorb the work substrate W. Since the dielectric plate 21 is a sapphire substrate, and the base plate 24 is made of an alumina ceramic material, the adsorption electrode 22 has a resistance change rate of 20% or less in a temperature range of −200° C. to 400° C. Then, the dielectric plate 21 and the base plate 24 are integrally bonded via the adsorption electrode 22.

According to the electrostatic chuck apparatus 10 of the present embodiment, since the bonding agent is not included in the electrostatic chuck 20, dust and discharge may be suppressed from occurring. On the other hand, the bonding agent 30 is utilized for bonding the electrostatic chuck 20 and the supporting plate 40 such that the bonding agent 30 is spaced apart from the upper surface of the electrostatic chuck 20, that is, the dielectric plate 21. As a result, the bonding agent 30 is hardly affected by the plasma and hardly generates dust or discharge.

As described above, the present embodiment has the following advantages.

(1) The electrostatic chuck 20 includes a dielectric plate 21 on which the work substrate W is mounted, the base plate 24 of supporting the dielectric plate 21, and the adsorption electrode interposed between the dielectric plate 21 and the base plate 24, and being configured for generating an electrostatic force for absorbing the work substrate W. Further, the dielectric plate 21 is a sapphire substrate, and the base plate 24 is made of an alumina ceramic material. The adsorption electrode 22 has a resistance change rate of 20% or less in a temperature range of −200° C. to 400° C. Then, the dielectric plate 21 and the base plate 24 are integrally bonded via the adsorption electrode 22. The sapphire substrate consists of a single crystal material of aluminum oxide ($Al_2O_3$), has no grain boundaries, and, thus, has excellent plasma resistance characteristics. Since the bonding agent is not included in the electrostatic chuck 20, dust and discharge may be suppressed from occurring.

(2) The electrostatic chuck 20 of the present embodiment includes the dielectric plate 21 made of a sapphire substrate, the base plate 24 made of alumina ceramic material ($Al_2O_3$), and the adsorption electrode 22 interposed between the dielectric plate 21 and the base plate 24. The adsorption electrode 22 consists of a composite material including both the ceramic material containing alumina ceramic material ($Al_2O_3$) and the conductive material containing an AlTiC material. The adsorption electrode 22 is formed using alumina ceramic material ($Al_2O_3$), a conductive material, and an oxidized grain eutectic material. Therefore, the adsorption electrode 22 may be sintered at a relatively low temperature (e.g. 1,750° C. or less), which makes little influence on the dielectric substrate. At a sintering temperature of 1750° C. or higher, the sapphire crystal structure of the dielectric plate 21 undergoes alteration, to cause deterioration in characteristics of the dielectric plate 21 to occur. Therefore, according to an example embodiment of the present invention, since the adsorption electrode 22 is sintered at the relatively low temperature, characteristics such as corrosion resistance of the dielectric plate 21 made of a sapphire substrate may be suppressed from deteriorating.

(3) Since the conductive material of the adsorption electrode 22 includes AlTiC material, AlTiC material has a relatively low temperature dependence of the resistance value. Thus, the resistance change rate of the electrostatic chuck 20 may be suppressed to 20% or less in a wide temperature range of −200° C. to 400° C.

(4) Each of the dielectric plate 21, the adsorption electrode 22, the insulating layer 23, and the base plate 24 of which all constitutes the electrostatic chuck 20 has a thermal expansion coefficient of less than $8.0 \times 10-6/K$. Therefore, the electrostatic chuck 20 may be utilized in a wide temperature range and may be adopted into various processing apparatuses for transporting the work substrate W.

(5) The dielectric plate 21 has a plurality of the convex portions 26 formed on the upper surface 21a thereof. The diameter of each of the convex portions 26 is in a range of 0.3 mm to 3.0 mm, and the height of each of the convex portions 26 is 0.05 mm or less. Each of convex portions 26 includes a ridge portion 26a curved toward the side surface 26b at the upper end portion thereof, and the radius of the ridge portions 26a is 0.03 mm or less. Due to the convex portions 26, the work substrate W may be easily absorbed to the dielectric plate 21. In addition, the convex portions 26 may facilitate the work substrate W to be detached from the dielectric plate 21

Note that each of the above embodiments may be implemented in the following manner. In the above-described embodiment, the electrostatic chuck 20 may be directly joined to the supporting plate 40.

Figure 15:
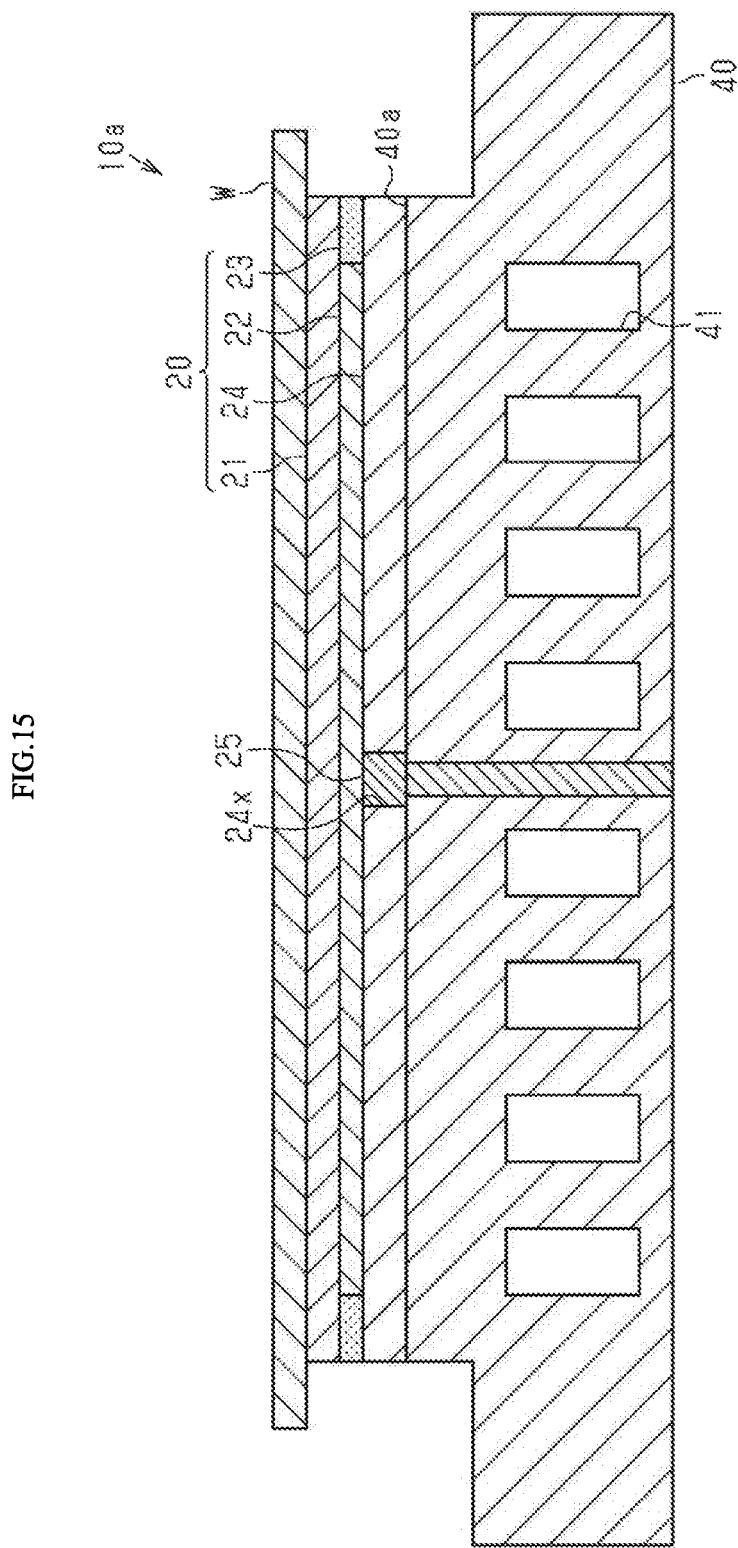
FIG. 15 is a cross sectional view illustrating an electrostatic chuck apparatus in accordance with an example embodiment of the present disclosure.

FIG. 15 is a cross sectional view illustrating an electrostatic chuck apparatus in accordance with an example embodiment of the present disclosure.

FIG. 15 shows an electrostatic chuck apparatus 10a according to a modified embodiment. The electrostatic chuck apparatus 10a includes a supporting plate 40 and an electrostatic chuck 20. The electrostatic chuck 20 is directly bonded to an upper surface 40a of the supporting plate 40 without using the bonding agent 30 of the above-described embodiment. As a method of directly joining the electrostatic chuck 20 and the supporting plate 40, a room temperature boding method may be utilized.

In an example embodiment, the conductive paste may include another conductive material such as titanium oxide ($TiO_2$).

In an example embodiment, a heater may be embedded in the electrostatic chuck 20. Alternatively, the heater may be embedded in the supporting plate 40.

In an example embodiment, the work substrate W may include the semiconductor wafer, but includes, for example, a substrate used for a liquid crystal display device or the like Although the electrostatic chuck and the electrostatic chuck apparatus having the same have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. An electrostatic chuck that fixes a work substrate using an electrostatic force, the electrostatic chuck comprising:
    a dielectric plate being configured to support the work substrate;
    a base plate being configured to support the dielectric plate; and
    an adsorption electrode interposed between the dielectric plate and the base plate, and being configured to generate an electrostatic force for adsorbing the work substrate, wherein
    the dielectric plate is a sapphire plate,
    the base plate consists of an alumina ceramic material,
    the adsorption electrode has a resistance change rate of 20% or less in a range of 200° C. to 400° C.,
    the dielectric plate and the base plate are integrally bonded through the adsorption electrode, and
    the adsorption electrode consists of a ceramic composite having an alumina ceramic material, a conductive material and an oxide-based eutectic material.

2. The electrostatic chuck of claim 1, wherein the dielectric plate and the base plate are re-sintered with the adsorption electrode.

3. The electrostatic chuck of claim 2, wherein the base plate include a through hole penetrating along a thickness direction, and a power supply electrode disposed in the through hole and electrically connected to the adsorption electrode,
    wherein the power supply electrode includes a material identical to that of the adsorption electrode.

4. The electrostatic chuck of claim 1, wherein the base plate includes a through hole penetrating along a thickness direction, a power supply electrode is disposed in the through hole to be electrically connected to the adsorption electrode, and the power supply electrode includes a material identical to that of the adsorption electrode.

5. The electrostatic chuck of claim 1, wherein each of the dielectric plate, the adsorption electrode, and the base plate has a linear thermal expansion coefficient of $8.0 \times 10^{-6}$/K or less.

6. The electrostatic chuck of claim 1, wherein an upper surface of the dielectric plate has a surface roughness Ra of 0.05 µm or less.

7. The electrostatic chuck of claim 1, wherein the dielectric plate includes a convex portion which protrudes from an upper surface thereof, the convex portion has a diameter of 0.3 mm to 3.0 mm or less and a height of 0.05 mm or less, and the convex portion includes a ridge portion formed at an upper end thereof and curved along a side thereof, and the ridge portion has a radius of 0.03 mm or less.

8. The electrostatic chuck of claim 7, wherein an upper surface of the dielectric plate has a surface roughness Ra of 0.3 µm or less.

9. An electrostatic chuck apparatus comprising:
an electrostatic chuck that fixes a work substrate by an electrostatic force, the electrostatic chuck comprising:
a dielectric plate being configured to support the work substrate;
a base plate being configured to support the dielectric plate; and
an adsorption electrode interposed between the dielectric plate and the base plate, and being configured to generate an electrostatic force for adsorbing the work substrate, wherein
the dielectric plate is a sapphire plate,
the base plate consists of an alumina ceramic material,
the adsorption electrode has a resistance change rate of 20% or less in a range of −200° C. to 400° C., and
the dielectric plate and the base plate are integrally bonded through the adsorption electrode,
a supporting plate including a flow path through which a coolant for cooling the electrostatic chuck flows; and
a bonding agent for bonding the electrostatic chuck and the supporting plate,
wherein the adsorption electrode consists of a ceramic composite having an alumina ceramic material, a conductive material and an oxide-based eutectic material.

10. An electrostatic chuck apparatus comprising:
an electrostatic chuck that fixes a work substrate by an electrostatic force; and
the electrostatic chuck comprising:
a dielectric plate being configured to support the work substrate;
a base plate being configured to support the dielectric plate; and
an adsorption electrode interposed between the dielectric plate and the base plate, and being configured to generate an electrostatic force for adsorbing the work substrate, wherein
the dielectric plate is a sapphire plate,
the base plate consists of an alumina ceramic material,
the adsorption electrode has a resistance change rate of 20% or less in a range of −200° C. to 400° C., and
the dielectric plate and the base plate are integrally bonded through the adsorption electrode,
a supporting plate including a flow path through which a coolant for cooling the electrostatic chuck flows, wherein
the electrostatic chuck is directly bonded to the supporting plate, and
the adsorption electrode consists of a ceramic composite having an alumina ceramic material, a conductive material and an oxide-based eutectic material.

* * * * *